(12) United States Patent
Happoya

(10) Patent No.: US 7,361,848 B2
(45) Date of Patent: Apr. 22, 2008

(54) WIRING BOARD, MAGNETIC DISC APPARATUS, AND MANUFACTURING METHOD OF WIRING BOARD

(75) Inventor: Akihiko Happoya, Fussa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 409 days.

(21) Appl. No.: 11/046,739

(22) Filed: Feb. 1, 2005

(65) Prior Publication Data

US 2005/0274542 A1    Dec. 15, 2005

(30) Foreign Application Priority Data

Jun. 15, 2004    (JP) .............................. 2004-177044

(51) Int. Cl.
*H05K 1/00* (2006.01)
(52) U.S. Cl. ...................... 174/262; 174/254; 361/748; 361/792
(58) Field of Classification Search ................. 174/254, 174/262–266; 361/748–751, 792–795
See application file for complete search history.

(56) References Cited

U.S. PATENT DOCUMENTS 5,615,088 A * 3/1997 Mizumo ...................... 361/749

FOREIGN PATENT DOCUMENTS

JP    2002-064271    2/2002

\* cited by examiner

*Primary Examiner*—Jeremy C Norris
(74) *Attorney, Agent, or Firm*—Pillsbury Winthrop Shaw Pittman LLP

(57) ABSTRACT

Disclosed is a wiring board including: a first insulating layer made of a flexible material; a second insulating layer stacked on a partial region of the first insulating layer; a first wiring layer disposed between the first insulating layer and the second insulating layer; and a second wiring layer disposed on the second insulating layer, wherein the first insulating layer is composed of two or more insulating layers and further has a third wiring layer in each interlayer of the two or more insulating layers, wherein an electric interlayer connection between the first wiring layer and the third wiring layer has a plating layer of a hollow cylindrical shape or a hollow truncated cone shape, and inside of the hollow is filled by a material of the second insulating layer being transformed and entering therein.

6 Claims, 5 Drawing Sheets

WIRING BOARD, MAGNETIC DISC APPARATUS, AND MANUFACTURING METHOD OF WIRING BOARD

CROSS-REFERENCE TO THE INVENTION

This application is based upon and claims the benefit of priority from the prior Japanese Patent Application No.2004-177044, filed on Jun. 15, 2004; the entire contents of which are incorporated herein by reference.

BACKGROUND

1. Field of the Invention

The present invention relates to a wiring board and a manufacturing method thereof, as well as a magnetic disc apparatus having the wiring board and, more particularly, to a wiring board which is applied to the magnetic disc apparatus and preferable for miniaturization thereof and the manufacturing method of the wiring board, as well as to the magnetic disc apparatus having such a wiring board.

2. Description of the Related Art

As a portable device and an electronic device become more sophisticated and reduced in size and weight, miniaturization is required also in a magnetic disc apparatus being a representative apparatus for storing large volume digital information. In such a small magnetic disc apparatus, elaborate contribution to miniaturization is required to be made not only by a disc enclosure part being a container member in which a disc and the like are accommodated but also by a flexible wiring board equivalent to a cable for exchanging signals with the outside.

The flexible wiring board for a connection of a mounting wiring board disposed in the disc enclosure to the outside can be required to provide a mounting region for an electric/electrical part in a partial area thereof. In this way, the flexible wiring board extended in the magnetic disc apparatus can be required to have another function than a function as a mere cable. Incidentally, a conventional art which can be adopted as such a wiring board is disclosed in a patent document 1 stated below. In this art, a board material in a flexible region and a board material in a rigid region are connected by a specialized film base material. An electric interlayer connection via the film base material is conducted by filling a conductor in a through hole bored on the film base material. Accordingly, a structure is rather complicated.

[Patent Document 1] Japanese Patent Laid-open Application No. 2002-64271

SUMMARY

The present invention is achieved in view of the above-described circumstances. It is an object of the present invention, in a wiring board and a manufacturing method thereof as well as a magnetic disc apparatus having that wiring board, to provide a wiring board which has a simpler structure, can cope with a function such as of mounting a part, and also can contribute to miniaturization of the magnetic disc apparatus, and a manufacturing method thereof, as well as the magnetic disc apparatus having such a wiring board.

A wiring board according to an aspect of the present invention includes: a first insulating layer made of a flexible material; a second insulating layer stacked on a partial region of the first insulating layer; a first wiring layer disposed between the first insulating layer and the second insulating layer; and a second wiring layer disposed on the second insulating layer, wherein the first insulating layer is composed of two or more insulating layers and further has a third wiring layer in each interlayer of the two or more insulating layers, wherein an electric interlayer connection between the first wiring layer and the third wiring layer has a plating layer of a hollow cylindrical shape or a hollow truncated cone shape, and inside of the hollow is filled by a material of the second insulating layer being transformed and entering therein.

More specifically, as a structure, there exist two or more first insulating layers made of flexible materials, and an interlayer connection between the third wiring layer existing in the interlayer of the two or more insulating layers and the first wiring layer existing on the first insulating layer has the plating layer of the hollow cylindrical shape or the hollow truncated cone shape. Further, the inside of the hollow is filled by the material of the second insulating layer which is stacked on the first insulating layer, the material being transformed and entering therein. In such a structure, stacking of the first insulating layer made of the flexible material and stacking of the second insulating layer which is stacked thereon can be conducted by substantially the same process. Therefore, the structure becomes simpler. Additionally, a part can be mounted on the second wiring layer. Moreover, by stacking the second insulating layer only on a necessary region and only of a necessary number of layers, the wiring board becomes lightweight (small, thin) as a whole.

A magnetic disc apparatus according to another aspect of the present invention includes: a wiring board including a first insulating layer made of a flexible material, a second insulating layer stacked on a partial region of the first insulating layer, a first wiring layer disposed between the first insulating layer and the second insulating layer, and a second wiring layer disposed on the second insulating layer, wherein the first insulating layer is composed of two or more insulating layers and further has a third wiring layer in each interlayer of the two or more insulating layers, and wherein an electric inter layer connection between the first wiring layer and the third wiring layer has a plating layer of a hollow cylindrical shape or a hollow truncated cone shape, and inside of the hollow is filled by a material of the second insulating layer being transformed and entering therein, the second wiring layer including a land for mounting a surface mounting type connector; a surface mounting type connector mounted on the land; and a close-type disc enclosure electrically connected to the wiring board via the surface mounting type mounting connector.

More specifically, this magnetic disc apparatus has a structure in that a surface mounting type connector is mounted on the second wiring layer of the above-described wiring board, and via this mounted connector, the wiring board and the disc enclosure are connected. Therefore, the apparatus can contribute to miniaturization of the magnetic disc apparatus.

A manufacturing method of the wiring board according to an aspect of the present invention includes: patterning a metal layer stacked on a first insulating layer made of a flexible material; stack integrating a flexible second insulating layer on the first insulating layer having the patterned metal layer; opening a hole reaching the patterned metal layer, on a predetermined position of the second insulating layer; forming a plating layer on the second insulating layer including an internal surface of the opened hole; patterning the formed plating layer; and disposing, pressurizing/heating, and stack integrating a resin layer having flowability by heat, on a partial region of the second insulating layer having the patterned plating layer.

This manufacturing method is an example of manufacturing the above-described wiring board.

According to the present invention, there can be provided a wiring board which has a simpler structure, can cope with a function such as of mounting a part, and also can contribute to miniaturization of the magnetic disc apparatus, and a manufacturing method of such a wiring board, as well as a magnetic disc apparatus having such a wiring board.

DETAILED DESCRIPTION

Description of the Embodiments

Embodiments of the present invention will be described with reference to the drawings, but these drawings are provided only for an illustrative purpose and by no means are intended to limit the present invention.

As a form of an embodiments of the present invention, it is possible that the second insulating layer is composed of two or more insulating layers and further have a fourth wiring layer in each interlayer of the two or more insulating layers. This is a case to obtain a further multilayer wiring board by the fourth wiring layer.

As another form, it is possible that the second insulating layer is not a flexible material. A rigid material can be used for the second insulating layer, for example. This can be applied to a case that flexibility is not required in such a region.

As still another form, it is possible that the second wiring layer has a land for mounting a surface mounting type connector. This is for mounting a surface mounting type connector for a connection with a disc enclosure.

As yet another form, it is possible that a shape of a region where the second insulating layer is not stacked, of the first insulating layer, is a ribbon shape. The ribbon shape is easy to cope with various transformations, and is well adaptable to assembly in a portable device and an electronic device.

As still yet another form, it is possible that there is further included a stainless steel layer stacked on an opposite side, of the first insulating layer, to a side on which the second insulating layer is stacked. Existence of the stainless steel layer increases stiffness of the flexible first insulating layer and facilitates handling in a manufacturing process. The stainless steel layer in an unnecessary region can be later removed by etching, for example.

Figure 1A:
FIG. 1A to FIG. 1I are process drawings in which a manufacturing process of a wiring board according to an embodiment of the present invention is shown by schematic sectional views.

Based on the above, an embodiment of the present invention will be hereinafter described in view of the drawings. FIG. 1A to FIG. 1I are process drawings in which a manufacturing process of a wiring board according to the embodiment of the present invention is shown by schematic sectional views. In these drawings, the same or substantially the same portions are represented by the same reference numerals and symbols. First, as shown in FIG. 1A, there is prepared a board of a polyimide layer 11 to one side of which a copper layer 12 as a metal layer is attached. The polyimide layer 11 is a flexible material and at the same time an insulating layer. Flexible insulating materials such as a liquid crystal polymer or an aramide can be used instead of the polyimide layer 11. A planar shape of this board will be described later.

Figure 1B:
Figure 1C:

Next, as shown in FIG. 1B, the copper layer 12 is patterned to a predetermined pattern so that a pattern formed copper layer 12a is obtained. This patterning can be conducted by etching processing using, for example, a well-known photolithography method. The pattern formed copper layer 12a functions as one of wiring layers. Next, as shown in FIG. 1C, on a surface on which the pattern formed copper layer 12a exists, a polyimide layer 13 is stacked and integrated For this stack integration, vacuum press by pressurizing/heating in a stack direction, for example, can be used.

Figure 1D:

Subsequently, as shown in FIG. 1D, on a predetermined position of the stacked polyimde layer 13, openings 14a or a removed portion 14b which reach the pattern formed copper layer 12a are formed. For formation of the openings 14a and the removed portion 14b, laser processing and etching processing, for example, can be used. Otherwise, instead of the polyimide layer 13 a material with both flexibility and photosensitivity can be stacked, exposed to a predetermined pattern, and then developed, so that the openings 14a and the removed portion 14b can be formed. Shapes of the openings 14a can be cylindrical or, depending on a sate of the laser processing, truncated cone shapes of which basal planes having smaller areas are on the copper layer 12a side.

Figure 1E:
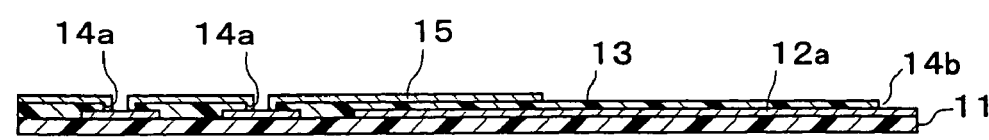
Figure 1F:

Next, as shown in FIG. 1E, on an entire predetermined region of the polyimide layer 13 including on an internal surfaces of the openings 14a, a plating layer 15 of copper, for example, is formed. For formation of the plating layer 15, it is possible to use, for example, a well-known method of two-stage plating layer formation by electroless plating and electrolytic plating. Additionally, as shown in FIG. 1F, the formed plating layer 15 is patterned to a predetermined pattern so that a pattern formed plating layer 15a is obtained. The pattern formed plating layer 15a functions as one of wiring layers. An electric interlayer connection of the pattern formed plating layer 15a to the copper layer 12a is conducted by the plating layers of hollow cylindrical shapes or hollow truncated cone shapes.

To process steps shown by FIG. 1C to FIG. 1F, a following modification example can be applied. First, at the step of FIG. 1C, a polyimide layer 13 to one side of which a copper layer is already attached is prepared and stack integrated, with this polyimide layer being lower side, on a multilayer body shown in FIG. 1B. Next, the copper layer on the polyimide layer 13 at positions where the openings 14a and the removed portion 14b are to be formed is etched and removed by using the well-known photolithography method, for example. Additionally, with a mask of the copper layer remaining from the etching, the polyimide layer 13 is, for example, laser processed or etching processed so that the openings 14a and the removed portion 14b are formed.

Subsequently, on an entire surface of the copper layer including on an internal surfaces of the openings 14a, a plating layer of copper, for example, is formed. Then, the copper layer including the formed plating layer is patterned to a predetermined pattern so that a pattern formed plating layer is obtained. In this modification example, for formation of the plating layer of copper the step of electroless plating can be performed in shorter time. It is because copper layer formation by electroless plating is required to be performed only on the internal surfaces of the openings 14a.

Figure 1G:
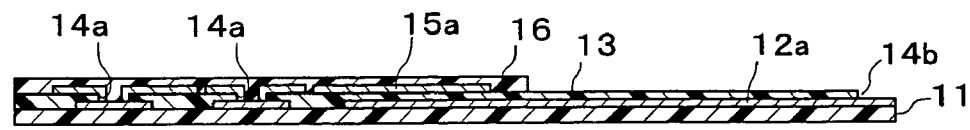

After the pattern formed plating layer 15a is obtained, next, as shown in FIG. 1G, a thermosetting resin layer 16 as an insulating layer is stacked on a predetermined region of the polyimide layer 13 and integrated. For the thermosetting resin layer 16, for example, epoxy resin being a rigid material, can be used. Depending on use as the wiring board, a flexible material can be used instead of the rigid material. In stack integration of the thermosetting resin layer 16, the resin fluidizes during pressurizing/heating press in the stack direction and transforms to also enter hollows surrounded by the plating layer of the internal surface of the openings 14a.

Figure 1H:
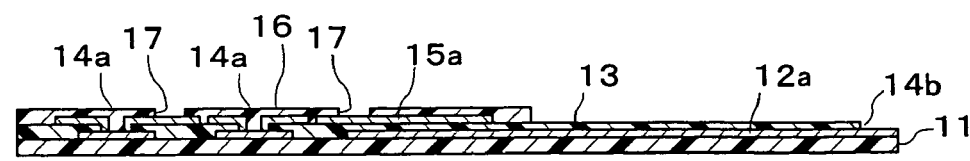

Next, as shown in FIG. 1H, on predetermined positions of the stacked thermosetting resin layer 16, openings 17 which reach the pattern formed plating layer 15a are formed. For formation of the openings 17, laser processing and etching processing, for example, can be used. Otherwise, as the thermosetting resin layer 16 a photosensitive material is stacked, exposed to a predetermined pattern, and then developed so that the openings 17 are formed. Shapes of the openings 17 can also be, as the openings 14a, cylindrical or, depending on the sate of the laser processing, truncated cone shapes of which basal planes having smaller areas are on the plating layer 15a side and the like.

Figure 1I:
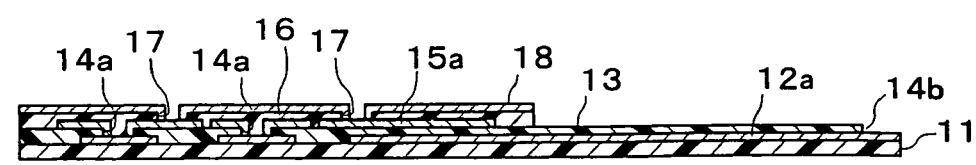

Next, as shown in FIG. 1I, on an entire surface of the thermosetting resin layer 16 including internal surfaces of the openings 17, a plating layer 18 of copper, for example, is formed. For formation of the plating layer 18, similarly to formation of the plating layer 15, it is possible to use, for example, the well-known method of two-stage plating layer formation by electroless plating and electrolytic plating. Additionally, the formed plating layer 18 is patterned to a predetermined pattern so that a pattern formed plating layer is obtained. The pattern formed plating layer functions as one of the wiring layers. An electric interlayer connection of this pattern formed plating layer to the plating layer 15a is conducted by the plating layers of hollow cylindrical shapes or hollow truncated cone shapes.

Incidentally, to the above process steps of FIG. 1G and after FIG. 1G, the same process steps as the above-described modification example for FIG. 1C to FIG. 1F can be applied.

Figure 2A:
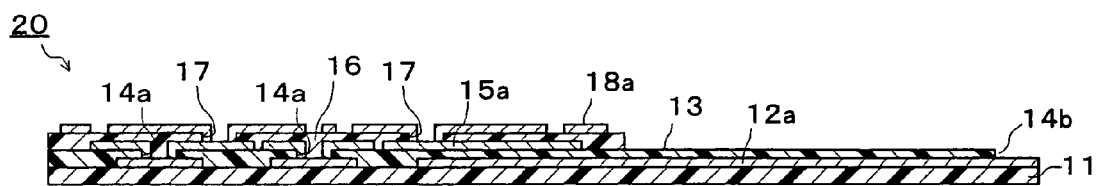
FIG. 2A and FIG. 2B are a sectional view (FIG. 2A) and a top view (FIG. 2B) which show a structure of the wiring board according to the embodiment of the present invention.
Figure 2B:
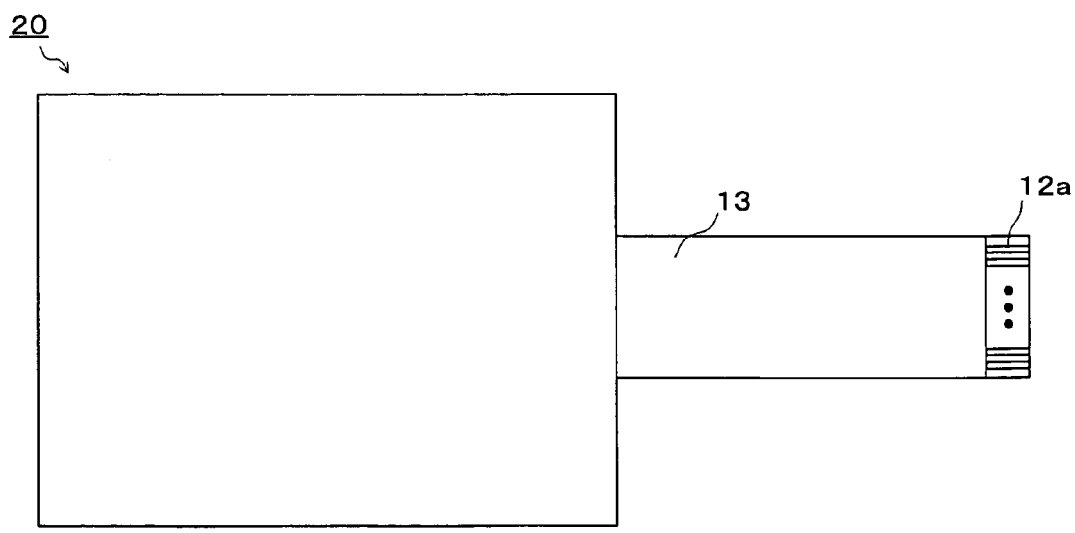

FIG. 2A and FIG. 2B are a sectional view and a top view which show a structure of the wiring board according to the embodiment of the present invention, at the same time drawings which show the wiring board obtained by process steps shown in FIG. 1A to FIG. 1I. In FIG. 2A and FIG. 2B, the same or substantially the same portions as in FIG. 1A and FIG. 1I are represented by the same reference numerals and symbols. In FIGS. 2A and 2B, a pattern formed plating layer 18a on the thermosetting resin layer 16 is obtained by patterning the plating layer 18 (FIG. 1I).

In this wiring board 20, as shown in FIG. 2B, a rectangular part (a region of the thermosetting resin layer 16) is a rigid region, and a ribbon shaped part extended from this rectangular part is a flexible region. The polyimide layers 11 and 13 exist also in the rigid region, in lower layers thereof. The ribbon shaped part has a function as a cable, with a tip thereof being a terminal portion to be connected to a connector by exposure of the pattern formed copper layer 12a (in fact, a surface thereof is corrosion proofed).

From this terminal portion a wiring of the copper layer 12a stretches, and in the rigid region the wiring board has three wiring layers. On a top surface of the thermosetting resin 16 side, it is possible to provide a land for mounting various electronic/electric parts (passive parts and active parts as well as, for example, a surface mounting type connector and the like) by the wiring layer (plating layer 18a). On a region except the land, a solder resist (not shown) can be formed as necessary.

In the wiring board 20 having the rigid region and the flexible region as above, stacking of the insulating layers (polyimide layers 11 and 13) made of the flexible material and stacking of the insulating layer (thermosetting resin layer 16) which is stacked thereabove can be conducted by substantially the same process, as described above. Therefore, the structure is simpler. Additionally, on the wiring layer (plating layer 18a) on the thermosetting resin layer 16, the parts can be mounted. Moreover, by stacking the thermosetting resin layer 16 only on a necessary region and only of a necessary number of layers, the wiring board becomes lightweight (small, thin) as a whole. The number of the wiring layers can be increased by further stacking the thermosetting resin layers and the pattern formed plating layers on the thermosetting resin layer 16.

Further, though not shown, it is also possible to provide the polyimide layer 11 with an opening which reaches the copper layer 12a by, for example, etching processing, as necessary. The wiring board can have such a structure as this opening as an inspection pad for conducting an electric inspection from a polyimide layer 11 side.

Figure 3A:
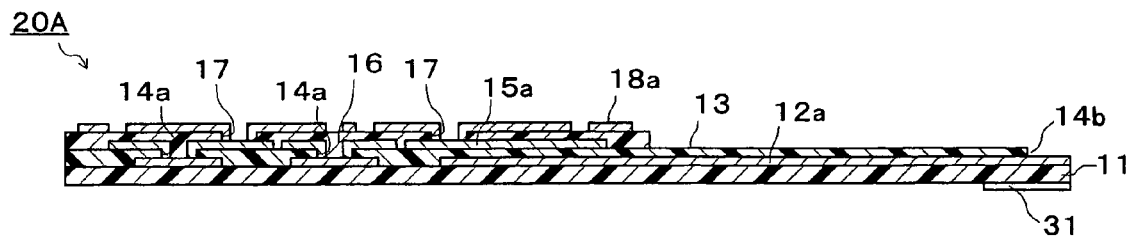
FIG. 3A and FIG. 3B are a sectional view (FIG. 3A) and a top view (FIG. 3B) which show a structure of a wiring board according to another embodiment of the present invention.
Figure 3B:
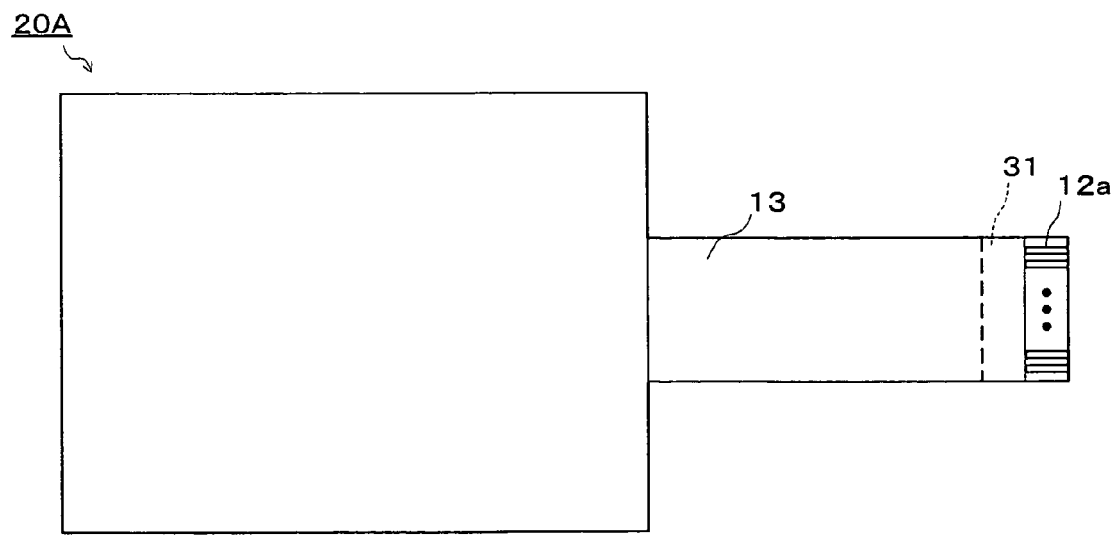

Next, a wiring board according to another embodiment of the present invention will be described with reference to FIG. 3A and FIG. 3B. FIG. 3A and FIG. 3B are a sectional view and a top view which show a structure of the wiring board according to another embodiment of the present invention. In FIG. 3A and FIG. 3B, the same or substantially the same portions as those already described are represented by the same reference numerals and symbols. Descriptions thereof will be restrained unless addition is made.

In the wiring board 20A of this embodiment, a stainless steel layer 31 is provided on a part of a bottom surface side of a polyimide layer 11 being a lowest layer. In this embodiment, the stainless steel layer 31 reinforces a terminal portion which is provided on a tip of a flexible region, by increasing stiffness thereof. Such reinforcement increases durability of a flexible part in a connection to a connector.

The wiring board 20A as above can be manufactured by following process steps, for example. In a step shown in FIG. 1A, a laminate having a stacked structure of, from below, the stainless steel layer, the polyimide layer 11, and a copper layer 12 is used. Such a laminate is well-known and easy to obtain. Steps of FIG. 1B and after FIG. 1B are conducted in the same way as in a previous embodiment. In these process steps, since the laminate with the stainless steel layer is used as the bottom layer, the stiffness is increased than in a case with only the polyimide layer 11. Therefore, deformation hardly occurs and workability is improved. Additionally, in a case of a structure in that a flexible material is used also for a thermosetting resin layer 16, mounting of parts on a plating layer 18a being a wiring layer thereon can be conducted more smoothly as well.

After all of the above work is finished, the stainless steel layer under the polyimide layer 11 is removed, with a necessary part being left, by etching for example. In this embodiment, as described above, the stainless steel layer 31 in a region corresponding to the terminal portion provided on the tip of the flexible region is left. However, stainless steel layer in other regions can be left as necessary. Incidentally, as a matter of course, the structure shown in FIG. 3A and FIG. 3B can be obtained by attaching the stainless steel layer 31 to a necessary region in the end after manufacturing as shown in FIG. 2A and FIG. 2B.

Figure 4A:
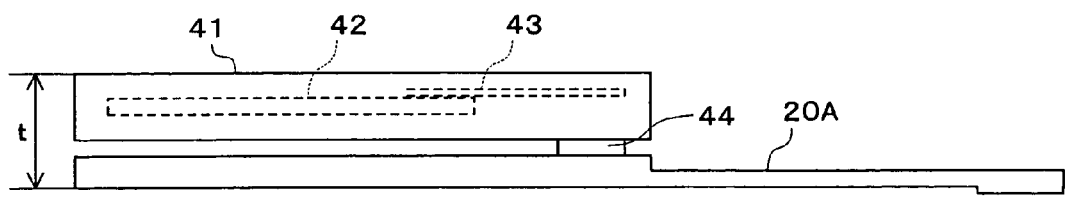
FIG. 4A and FIG. 4B are a front view (FIG. 4A) and a top view (FIG. 4B) which show a structure of a magnetic disc apparatus according to an embodiment of the present invention.
Figure 4B:
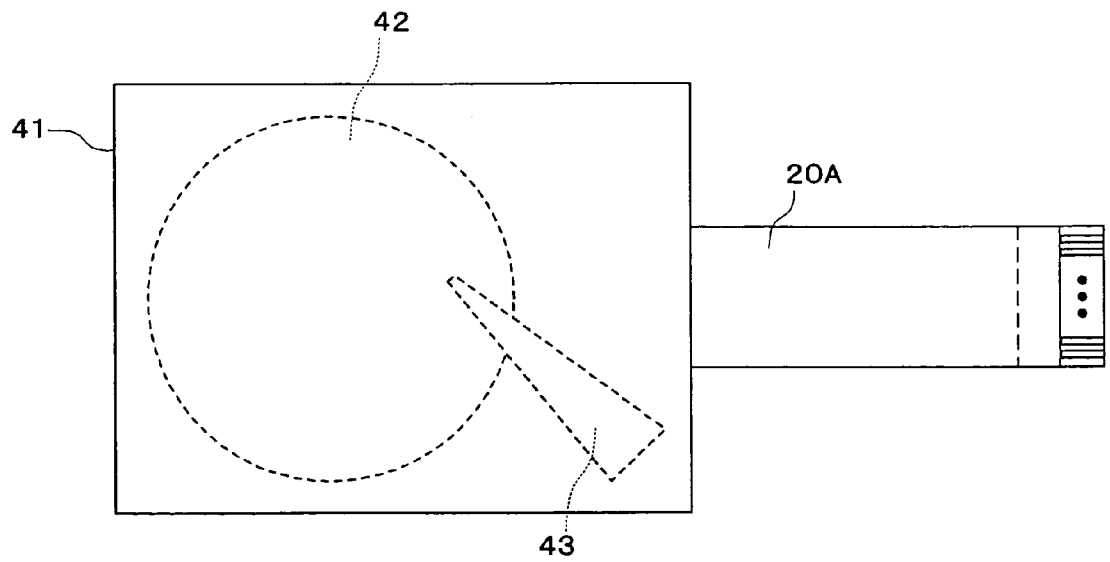

Next, a magnetic disc apparatus according to an embodiment of the present invention will be described with reference to FIG. 4A and FIG. 4B. FIG. 4A and FIG. 4B are a front view and a top view which show a structure of the magnetic disc apparatus according to the embodiment of the present invention. In FIG. 4A and FIG. 4B, the same components already described are represented by the same reference numerals and symbols.

In this magnetic disc apparatus, the above-described wiring board 20A is used as a cable for an electric connection with a close-type disc enclosure 41. As shown in the drawings, in the disc enclosure 41, there are included a magnetic disc 42 as a recording medium, an arm 43 having a magnetic head for reading/writing a signal from/in the magnetic disc 42 and moving in a radial direction thereof, and the like. Additionally, there is provided inside a mounting board for conducting electric processing such as signal processing, servo processing, and the like.

The disc enclosure 41 and the wiring board 20A are connected by a surface mounting type connector 44 which is provided in the rigid region of the wiring board 20A. The connector 44 conducts an electric connection with the mounting board provided inside. On a surface of the wiring board 20A on which the connector 44 is provided, other parts can be mounted as necessary.

As the magnetic disc apparatus with such a structure, there can be provided a small one with a thickness "t" thereof being for example approximately 3.3 mm, a shorter edge of the disc enclosure 41 in FIG. 4B being for example approximately 24 mm, and a longer edge being for example approximately 32 mm. The wiring board 20A also contributes to such miniaturization/thinning in the magnetic disc apparatus.

The present invention is not limited to the specific modes described here with the illustrations, but it is to be understood all the changes and modifications without departing from the range of the following claims are to be included therein.

What is claimed is:

1. A wiring board, comprising:
   a first insulating layer made of a flexible material;
   a second insulating layer stacked on a partial region of the first insulating layer;
   a first wiring layer disposed between the first insulating layer and the second insulating layer;
   a second wiring layer disposed on the second insulating layer, and
   a stainless steel layer stacked on an opposite side, of the first insulating layer, to a side on which the second insulating layer is stacked,
   wherein the first insulating layer is composed of two or more insulating layers and has a third wiring layer in each interlayer of the two or more insulating layers, and
   wherein an electric interlayer connection between the first wiring layer and the third wiring layer has a plating layer of a hollow cylindrical shape or a hollow truncated cone shape, and inside of the hollow is filled by a material of the second insulating layer being transformed and entering therein.

2. A wiring board according to claim 1, wherein the second insulating layer is composed of two or more insulating layers and further has a fourth wiring layer in each interlayer of the two or more insulating layers.

3. A wiring board according to claim 1, wherein the second insulating layer is not a flexible material.

4. A wiring board according to claim 1, wherein the second wiring layer has a land for mounting a surface mounting type connector.

5. A wiring board according to claim 1, wherein a shape of a region of the first insulating layer where the second insulating layer is not stacked is a ribbon shape.

6. A magnetic disc apparatus, comprising:
   a wiring board including a first insulating layer made of a flexible material, a second insulating layer stacked on a partial region of the first insulating layer, a first wiring layer disposed between the first insulating layer and the second insulating layer, and a second wiring layer disposed on the second insulating layer, wherein the first insulating layer is composed of two or more insulating layers and further has a third wiring layer in each interlayer of the two or more insulating layers, and wherein an electric interlayer connection between the first wiring layer and the third wiring layer has a plating layer of a hollow cylindrical shape or a hollow truncated cone shape and inside of the hollow is filled by a material of the second insulating layer being transformed and entering therein, the second wiring layer including a land;
   a surface mounting type connector mounted on the land; and
   a close-type disc enclosure electrically connected to the wiring board via the surface mounting type connector.

* * * * *